United States Patent
Alekel

(10) Patent No.: US 7,911,682 B2
(45) Date of Patent: *Mar. 22, 2011

(54) METHOD AND STRUCTURE FOR NONLINEAR OPTICS

(75) Inventor: Theodore Alekel, Portland, OR (US)

(73) Assignee: Deep Photonics Corporation, Vancouver, WA (US)

(*) Notice: Subject to any disclaimer, the term of this patent is extended or adjusted under 35 U.S.C. 154(b) by 0 days.

This patent is subject to a terminal disclaimer.

(21) Appl. No.: 12/404,289

(22) Filed: Mar. 14, 2009

(65) Prior Publication Data

US 2009/0256120 A1    Oct. 15, 2009

Related U.S. Application Data

(63) Continuation of application No. 12/140,162, filed on Jun. 16, 2008, now Pat. No. 7,504,053.

(60) Provisional application No. 61/044,413, filed on Apr. 11, 2008.

(51) Int. Cl.
*G02F 1/355* (2006.01)
*G02F 1/35* (2006.01)
*G02F 2/02* (2006.01)

(52) U.S. Cl. .................. 359/326; 359/328; 372/22

(58) Field of Classification Search .................. 359/246, 359/326–332; 385/122; 372/21, 22, 105; 252/584, 586–589, 301.4 R; 423/263; 313/486; 502/204; 65/33.2

See application file for complete search history.

(56) References Cited

U.S. PATENT DOCUMENTS

| | | | |
|---|---|---|---|
| 4,990,480 A | 2/1991 | Luetkens, Jr. et al. | |
| 5,030,851 A | 7/1991 | Unternahrer | |
| 5,043,308 A | 8/1991 | Luetkens, Jr. et al. | |
| 7,205,710 B2 | 4/2007 | Justel et al. | |
| 7,504,053 B1 | 3/2009 | Alekel | |
| 7,534,377 B2* | 5/2009 | Keszler et al. | 252/584 |
| 2006/0054864 A1 | 3/2006 | Alekel et al. | |
| 2008/0014135 A1 | 1/2008 | Alekel | |
| 2008/0041106 A1 | 2/2008 | Seneschal-Merz et al. | |
| 2008/0043787 A1 | 2/2008 | Keszler et al. | |

OTHER PUBLICATIONS

International Search Report and Written Opinion of PCT Application No. PCT/US09/36567, Apr. 9, 2009, 10 pages total.

* cited by examiner

*Primary Examiner* — Daniel Petkovsek
(74) *Attorney, Agent, or Firm* — Kilpatrick Townsend & Stockton LLP

(57) ABSTRACT

A nonlinear optical crystal having a chemical formula of $Y_i La_j Al_k B_{16} O_{48}$, where $2.8 \leq i \leq 3.2$, $0.8 \leq j \leq 1.2$, i and j sum to about four, and k is about 12 is provided. The nonlinear optical crystal is useful for nonlinear optical applications including frequency conversion. Nonlinear optical crystals in a specific embodiment are characterized by UV blocking materials (e.g., some transition metals and lanthanides) at concentrations of less than 1,000 parts per million, providing high transmittance over portions of the UV spectrum (e.g., 175-360 nm).

10 Claims, 5 Drawing Sheets

METHOD AND STRUCTURE FOR NONLINEAR OPTICS

CROSS-REFERENCES TO RELATED APPLICATIONS

The present application is a continuation of U.S. patent application Ser. No. 12/140,162, filed on Jun. 16, 2008, U.S. Pat. No. 7,504,053 B1, issued on Mar. 17, 2009, entitled "Method and Structure for Nonlinear Optics," which claims benefit under 35 U.S.C. §119(e) of U.S. Provisional Patent Application No. 61/044,413, filed on Apr. 11, 2008, entitled "Method and Structure for Nonlinear Optics," the disclosures of which are hereby incorporated by reference in their entirety for all purposes.

BACKGROUND OF THE INVENTION

The present invention relates generally to certain compounds having optical properties. More particularly, as an example, an embodiment of the invention provides a specific compound comprising $R_iLa_jAl_kB_{16}O_{48}$, where $2.0 \leq i \leq 3.6$, $0.4 \leq j \leq 2.0$, i and j sum to about four, k is about 12, and R is selected from an elemental group consisting of Y and Lu, for use with ultraviolet, visible, and infrared electromagnetic radiation. More specifically, another embodiment provides a compound comprising $Y_iLa_jAl_kB_{16}O_{48}$, where $2.8 \leq i \leq 3.2$, $0.8 \leq j \leq 1.2$, i and j sum to about four, and k is about 12, for use with ultraviolet, visible, and infrared electromagnetic radiation. Merely by way of example, the compound is useful for electromagnetic radiation having wavelengths of 175-360 nm, but it would be recognized that the invention has a much broader range of applicability.

Nonlinear optical (NLO) materials are unusual in that they affect the properties of light. A well-known example is the polarization of light by certain materials, such as when materials rotate the polarization vectors of incident light. If the effect on the polarization vector by the incident light is linear, then light emitted by the material has the same frequency as the incident light. NLO materials affect the polarization vector of the incident light in a nonlinear manner. As a result, the frequency of the light emitted by a nonlinear optical material is affected, also described as frequency conversion/converters.

For example, when a beam of coherent light of a given frequency, such as produced by a laser, propagates through a properly oriented NLO crystal having non-zero components of the second order polarizability tensor, the crystal will generate light at a different frequency, thus extending the useful frequency range of the laser. Generation of this light can be ascribed to processes such as sum-frequency generation (SFG), difference-frequency generation (DFG) and optical parametric amplification (OPA). Devices using NLO crystals include, but are not limited to up and down frequency converters, optical parametric oscillators, optical rectifiers, and optical switches.

Frequency generation in NLO materials is an important effect. For example, two monochromatic electromagnetic waves with frequencies $\omega_1$ and $\omega_2$ propagating through a properly oriented NLO crystal can result in generation of light at a variety of frequencies. Mechanisms defining the frequency of light using these two separate frequencies are sum-frequency generation (SFG) and difference-frequency generation (DFG). SFG is a process where light of frequency $\omega_3$ is generated as the sum of the two incident frequencies, $\omega_3=\omega_1+\omega_2$. In other words, SFG is useful for converting long wavelength light to shorter wavelength light (e.g. near infrared to visible, or visible to ultraviolet). A special case of sum-frequency generation is second-harmonic generation (SHG) where $\omega_3=2\omega_1$, which is satisfied when the incident frequencies are equal, $\omega_1=\omega_2$. DFG is a process where light of frequency $\omega_4$ is generated as the difference of the incident frequencies $\omega_4=\omega_1-\omega_2$. DFG is useful for converting shorter wavelength light to longer wavelength light (e.g. visible to infrared). A special case of DFG is when $\omega_1=\omega_2$, hence $\omega_4=0$, which is known as optical rectification. Optical parametric oscillation (OPO) is also a form of DFG and is used to produce light at tunable frequencies.

The conversion efficiency of an NLO crystal for a particular application is dependent on a number of factors that include, but are not limited to: the effective nonlinearity of the crystal (pm/V), birefringence ($\Delta n$, where n is a refractive index), phase-matching conditions (Type I, Type II, non-critical, quasi, or critical), angular acceptance angle (radian-cm), temperature acceptance (K-cm), walk-off (radian), temperature dependent change in refractive index (dn/dT), optical transparency range (nm), optical damage threshold (W/cm$^2$), and optical longevity. Desirable NLO crystals possess an optimal combination of the above properties as defined by specific applications.

Optical materials commonly use boron as an elemental constituent because of its wide transparency and its robust bonding in oxides. Examples include its use as glass-formers (borosilicate glasses), phosphors in the form of powders, and as laser frequency converters. Borate crystals are used in various applications, such as laser-based manufacturing, medicine, hardware and instrumentation, communications, and research studies. Several borate compounds are commonly used as crystals in commercial lasers: beta barium borate (BBO: $\beta$-BaB$_2$O$_4$), lithium triborate (LBO: LiB$_3$O$_5$), and cesium lithium borate (CLBO: CsLiB$_4$O$_{10}$). These crystals are examples of borate-based NLO crystals developed in recent years that are being used widely as NLO devices, especially in applications that use ultraviolet light. Select properties suitable for generation of laser light from the mid-infrared to the ultraviolet for these crystals are listed in Table 1.

TABLE 1

| Commercially Available NLO Materials and Properties | | | |
|---|---|---|---|
| PROPERTY | BBO | LBO | CLBO |
| $D_{eff}$ (pm/V) | 2.2 | 0.8 | 0.9 |
| Optical Transmission (nm) | 190-3500 | 160-2600 | 180-2750 |
| Angular Acceptance (mrad-cm) | 0.8 | 6.5 | 0.6 |
| Temperature Acceptance (K-cm) | 55 | 7.5 | 2.5 |
| Walk-off Angle (deg.) | 3 | 0.6 | 1.8 |
| Damage Threshold (GW/cm$^2$) | 5 | 10 | 10 |
| Crystal Growth Properties | flux or congr. | flux | congruent |

BBO has a favorable nonlinearity (about 2.2 pm/V), transparency between 190 nm and 3500 nm, significant birefringence (necessary for phase matching), and a good damage threshold (5 GW/cm$^2$, 1064 nm, 0.1 ns pulse width). However, its high birefringence creates a relatively small angular acceptance that can limit conversion efficiencies and laser beam quality. The crystal is somewhat hygroscopic and is limited on the amount of optical power that can be transmuted.

LBO exhibits optical transparency throughout the visible electromagnetic spectrum, extending well into the ultraviolet (absorption edge at about 160 nm), and possesses a high damage threshold (10 GW/cm$^2$, 1064 nm, 0.1 ns pulse width).

However, it has insufficient intrinsic birefringence for phase-matching to generate deep UV radiation.

CLBO appears capable of producing UV light due to a combination of high nonlinearity and sufficient birefringence. The crystal can also be manufactured to relatively large dimensions. However, the crystal is exceedingly moisture sensitive and invariably absorbs water from the air; hence, extreme care usually must be taken to manage environmental moisture to prevent hydration stresses and possible crystal destruction.

Frequency conversion generally benefits from both high peak powers and tightly focused input beams, both of which increase the intensity of the input and output beams within the nonlinear optical material. However, the lifetime of NLO materials under such conditions for UV production limits the usefulness of frequency-converted UV laser systems. Commercial DUV NLO devices of prior art are generally fabricated from BBO and CLBO crystals. These NLO devices are unable to support long term, high-output UV light because of their intrinsic weakness to moisture. Water interacts with the material's surfaces and penetrates into its bulk, causing breakdown in the presence of high intensity laser beams. Previous attempts to mitigate this failure mode included using environmental isolation with hermetic cells, elevated temperatures to reduce water sorption, purging dry gasses, and mechanical devices to shift the position of the crystal relative to the laser beam. Ultimately, it is very difficult to overcome the intrinsic material failings of BBO and CLBO for deep UV NLO processes.

A related consequence to the hygroscopic nature of BBO and CLBO is that these NLO materials are limited in the degree to which they are able to support high intensity radiation. With activation energy supplied by high intensity input beams, surface damage on the polished faces is quickly promoted in the presence of water. The degradation propagates along the beam path into the bulk device, driven by the high intensity laser beam. This phenomenon limits the amount and duration of input laser radiation through the frequency converter. As a result, conversion efficiencies remain well below optimum and device operational lifetimes are significantly compromised. Clearly, a new UV frequency converter that is impervious to water represents the real solution to the problem.

To address these concerns for conventional UV NLO crystals, several more recent materials have been considered but have not yet realized commercial relevance: compounds such as potassium aluminum borate ($K_2Al_2B_2O_7$), yttrium lanthanum scandium borate (($Y,La)Sc_3(BO_3)_4$), and strontium beryllium borate ($Sr_2Be_2B_2O_7$). These materials have appeared in research discussions and offered improved resistance against moisture intrusion, but issues such as crystal growth constraints, inadequate or unsuitable optical properties, difficulty of manufacture, laser damage, etc. have prevented these and other candidates from becoming practical crystals for frequency conversion.

Another material considered as a UV-grade NLO frequency converter is $YAl_3(BO_3)_4$. This base formulation was put forward in 1960 by Ballman, and his potassium molybdate solvent of making crystals therein has remained as the primary means of growing crystal. As such and through the years, the pure form of YAB has not been commercially produced. The conventional method of production yields small crystal that contains a large amount of nonstoichiometric metals contamination and exhibits substandard crystal quality. Moreover, the solvent used introduces a considerable amount of contaminant that prevents device operation in the ultraviolet. The summary of work on huntite borates by Leonyuk & Leonyuk (1995) described a flux system that has subsequently remained as a method of producing YAB and its family members, namely the potassium molybdates $K_2MoO_4$ and $K_2Mo_3O_{10}$. Unfortunately, these solvent formulations possess severe limitations for large scale crystal growth: a) high flux volatility, b) small crystal yield, and c) significant inclusion of Mo atoms into the crystalline structure. This latter issue revealed the lower spectral limit of optical use, described as 350-360 nm.

Again, its operation and the historic method of preparation limit its use to the visible and infrared. Hence, it is highly desirable to improve techniques for this family of compounds that enable optical function down into the ultraviolet. Thus, there is a need in the art for improved methods and techniques for optical compounds.

SUMMARY OF THE INVENTION

According to the present invention, techniques related generally to certain compounds having optical properties are provided. More particularly, as an example, an embodiment of the invention provides a specific compound comprising $R_iLa_jAl_kB_{16}O_{48}$, where $2.0 \leq i \leq 3.6$, $0.4 \leq j \leq 2.0$, i and j sum to about four, k is about 12, and R is selected from an elemental group consisting of Y and Lu, for use with ultraviolet, visible, and infrared electromagnetic radiation. More specifically, another embodiment provides a compound comprising $Y_iLa_jAl_kB_{16}O_{48}$, where $2.8 \leq i \leq 3.2$, $0.8 \leq j \leq 1.2$, i and j sum to about four, and k is about 12, for use with ultraviolet, visible, and infrared electromagnetic radiation. Merely by way of example, the compound is useful for electromagnetic radiation having wavelengths of 175-360 nm, but it would be recognized that the invention has a much broader range of applicability.

According to one embodiment of the present invention, a compound for nonlinear optics is provided. The compound includes a material for nonlinear optics comprising $R_iLa_jAl_kB_{16}O_{48}$, where R=Y, i is about 3.04, j is about 0.96, and k is about 12. The elemental proportions of this compound is representative of a unique and stabilized phase that can preferentially emerge from the invention's range of composition $2.0 \leq i \leq 3.6$ and $0.4 \leq j \leq 2.0$. By way of example, $R_3LaAl_{12}B_{16}O_{48}$ (0.25 mol) represents a unique composition where R=Y and/or Lu, i is 3.00, and j is 1.00.

According to another embodiment of the present invention, a compound for nonlinear optics is provided. The compound includes a material for nonlinear optics comprising $Y_iLa_jAl_kB_{16}O_{48}$, where i is about 3.04, j is about 0.96, and k is about 12. The elemental proportions of this compound are representative of a unique and stabilized phase that can preferentially emerge from the invention's range of composition $2.8 \leq i \leq 3.2$ and $0.8 \leq j \leq 1.2$. By way of example, $Y_3LaAl_{12}B_{16}O_{48}$ represents a unique composition where i is 3, j is 1, and k is 12.

According to a specific embodiment, a composition of matter having the general formula $R_iLa_jAl_kB_{16}O_{48}$ is provided, where $2.0 \leq i \leq 3.6$, $0.4 \leq j \leq 2.0$, i and j sum to about four, k is about 12, and R is selected from an elemental group consisting of Y and Lu.

According to yet another embodiment of the present invention, a compound for nonlinear optics for use at wavelengths of 175-360 nm comprising a material for nonlinear optics includes $R_iLa_jAl_kB_{16}O_{48}$, where $2.0 \leq i \leq 3.6$, $0.4 \leq j \leq 2.0$, i and j sum to about four, k is about 12, and R is selected from an elemental group consisting of Y and Lu, for use with preferred wavelengths of electromagnetic radiation.

According to yet another embodiment of the present invention, a method for making a compound for nonlinear optics for use at wavelengths of 175-360 nm includes providing a plurality of materials. The plurality of materials includes an yttrium bearing compound and the yttrium bearing compound is capable of being decomposed into at least yttrium oxide upon heating. Additionally, the method includes mixing the plurality of materials to form a mixture based on at least information associated with a predetermined proportion, starting a crystallization process in the mixture to form a crystal, and removing the crystal from the mixture, the crystal including yttrium.

According to yet another embodiment of the present invention, a method for making a compound for nonlinear optics for use at wavelengths of 175-360 nm includes providing a plurality of materials. The plurality of materials includes a lutetium bearing compound, and the lutetium bearing compound is capable of being decomposed into at least lutetium oxide upon heating. Additionally, the method includes mixing the plurality of materials to form a mixture based on at least information associated with a predetermined proportion, starting a crystallization process in the mixture to form a crystal, and removing the crystal from the mixture, the crystal including lutetium.

According to yet another embodiment of the present invention, a method for making a compound for nonlinear optics for use at wavelengths of 175-360 nm includes providing a plurality of materials. The plurality of materials includes a lanthanum bearing compound, and the lanthanum bearing compound is capable of being decomposed into at least lanthanum oxide upon heating. Additionally, the method includes mixing the plurality of materials to form a mixture based on at least information associated with a predetermined proportion, starting a crystallization process in the mixture to form a crystal, and removing the crystal from the mixture, the crystal including lanthanum.

According to yet another embodiment of the present invention, a method for making a compound for nonlinear optics for use at wavelengths of 175-360 nm includes providing a plurality of materials. The plurality of materials includes an aluminum bearing compound, and the aluminum bearing compound is capable of being decomposed into at least aluminum oxide upon heating. Additionally, the method includes mixing the plurality of materials to form a mixture based on at least information associated with a predetermined proportion, starting a crystallization process in the mixture to form a crystal, and removing the crystal from the mixture, the crystal including aluminum.

According to yet another embodiment of the present invention, a method for making a compound for nonlinear optics for use at wavelengths of 175-360 nm includes providing a plurality of materials. The plurality of materials includes a boron bearing compound, and the boron bearing compound is capable of being decomposed into at least boron oxide upon heating. Additionally, the method includes mixing the plurality of materials to form a mixture based on at least information associated with a predetermined proportion, starting a crystallization process in the mixture to form a crystal, and removing the crystal from the mixture, the crystal including boron.

In a specific embodiment, a composition of matter (also referred to as a compound) having the general formula comprising $R_iLa_jAl_kB_{16}O_{48}$ is provided. In this specific embodiment, $2.0 \leq i \leq 3.6$, $0.4 \leq j \leq 2.0$, i and j sum to about four, k is about 12, and R is selected from an elemental group consisting of Y and Lu. In some nonlinear optical applications, the composition of matter is useful at wavelengths of less than or equal to about 360 nm. The compound may be a crystal phase. Additionally, the compound may include one or more bearing UV-blocking impurities at a concentration of less than 1000 parts per million. The one or more UV-blocking impurities may include a transition metal element or a lanthanide element other than Y, La, or Lu.

In a particular embodiment, the compound is free from bearing UV-blocking impurities of at least 1000 parts per million. Some uses of the compound as a nonlinear optical element are in the wavelength range from about 360 nm to about 175 nm. Other uses of the compound as a nonlinear optical element are in device (e.g., an NLO system, a light source, or a laser system) generating optical radiation at a wavelength less than 360 nm. In one embodiment, the compound is associated with the trigonal crystal class of space group R32 for use below 360 nm. The compound may have a volume greater than about 0.01 mm$^3$, about 0.1 mm$^3$ or about 1 mm$^3$.

In another specific embodiment, a method of growing single crystals of a composition is provided, having the general formula $R_iLa_jAl_kB_{16}O_{48}$, where $2.0 \leq i \leq 3.6$, $0.4 \leq j \leq 2.0$, i and j sum to about four, k is about 12, and R is selected from an elemental group consisting of Y and Lu is provided. The method includes heating the constituent components of the composition to a temperature on the order of 1500 K with a mixture of lanthanum oxide and boron oxide, the mole ratio of lanthanum compound to boron compound being in the range of 1:4 to 1:6, the nutrient-to-solvent ratio being in the range of 2:3 to 1:3, and cooling the resultant melt, whereby the composition precipitates from the melt as one or more crystals. In the method, cooling the resultant melt may be performed at a temperature rate of less than 1 K per day.

According to yet another specific embodiment, a method for making a compound for nonlinear optics for use at 360 nm and below is provided. The method includes providing a plurality of materials (e.g., lanthanum oxide or boron oxide). The plurality of materials includes a lanthanum bearing compound, the lanthanum bearing compound being capable of being decomposed into at least lanthanum oxide upon heating. The method also includes mixing the plurality of materials to form a mixture based on at least information associated with a predetermined proportion, starting a crystallization process in the mixture to form a huntite crystal (e.g., by inserting a crystalline seed to a melt surface), and removing the huntite crystal from the mixture. The huntite crystal includes lanthanum. In a exemplary, the crystal includes $R_iLa_jAl_kB_{16}O_{48}$, where $2.0 \leq i \leq 3.6$, $0.4 \leq j \leq 2.0$, i and j sum to about four, k is about 12, and R is selected from an elemental group consisting of Y and Lu.

The method may utilize a plurality of materials including a ratio of Y:La ranging from 4:6 to 4:16. The method may further include placing the mixture into a furnace or heating the mixture to a first predetermined temperature and cooling the mixture to a second predetermined temperature.

According to an additional embodiment, a method for making a compound for nonlinear optics for use at 360 nm and below is provided. The method includes providing a plurality of materials (e.g., yttrium oxide or boron oxide). The plurality of materials includes an yttrium bearing compound being capable of being decomposed into at least yttrium oxide upon heating. The method also includes mixing the plurality of materials to form a mixture based on at least information associated with a predetermined proportion, starting a crystallization process in the mixture to form a crystal (by inserting a crystalline seed to a melt surface), and removing the crystal from the mixture. The crystal includes yttrium. The crystal may be a composition of matter having the general formula $R_iLa_jAl_kB_{16}O_{48}$, where $2.0 \leq i \leq 3.6$, $0.4 \leq j \leq 2.0$, i and j sum to about four, k is about 12, and R is selected from an elemental group consisting of Y and Lu.

The method may also include placing the mixture into a furnace or heating the mixture to a first predetermined temperature and cooling the mixture to a second predetermined temperature.

Many benefits are achieved by way of the present invention over conventional techniques. For example, some embodiments of the present invention provide new methods of preparation that exclude contaminants that preclude the optical operation of borate huntites in the ultraviolet spectrum. In addition, a preparative method has been developed to allow rapid formation of crystal by using an inventive chemical recipe. Such methods enable the manufacture of large single crystals of the present invention, heretofore unattained in conventional methods. Also, a preparative method has been developed with a lower volatility of the starting mixture when heated to a melting temperature than conventional methods.

Various additional objects, features and advantages of the present invention can be more fully appreciated with reference to the detailed description and the accompanying drawings that follow.

DETAILED DESCRIPTION OF SPECIFIC EMBODIMENTS

Figure 1:
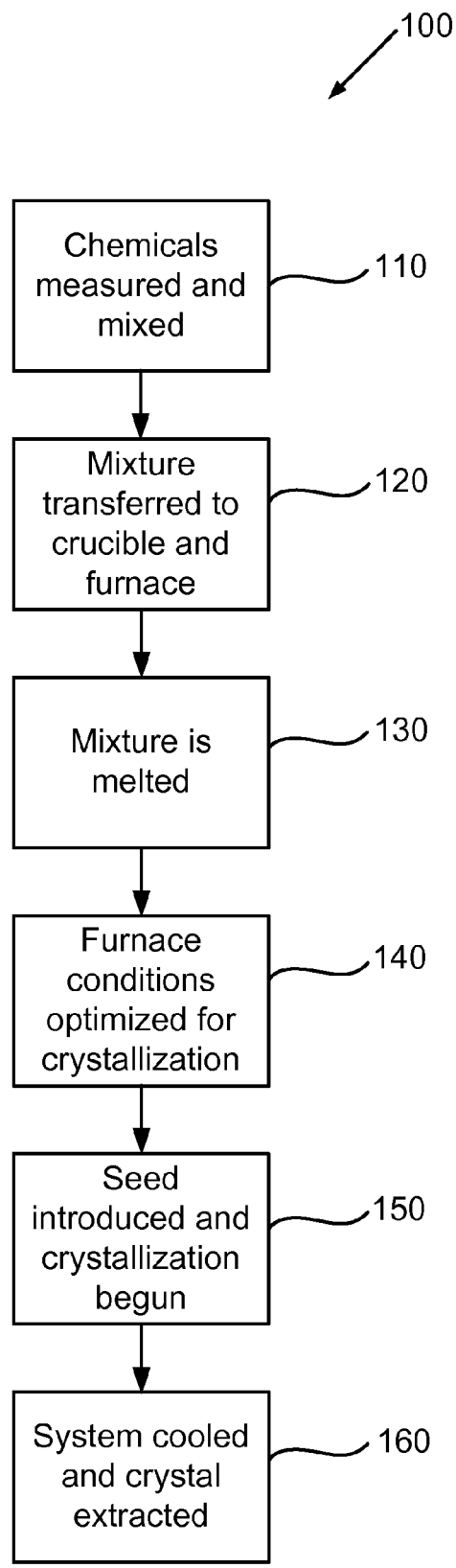
FIG. 1 is a simplified flowchart illustrating a method of making an optical compound according to an embodiment of the present invention.

According to the present invention, techniques related generally to certain compounds having optical properties are provided. More particularly, as an example, an embodiment of the invention provides a specific compound comprising $R_iLa_jAl_kB_{16}O_{48}$, where $2.0 \leq i \leq 3.6$, $0.4 \leq j \leq 2.0$, i and j sum to about four, k is about 12, and R is selected from an elemental group consisting of Y and Lu, for use with ultraviolet, visible, and infrared electromagnetic radiation. More specifically, another embodiment provides a compound comprising $Y_iLa_jAl_kB_{16}O_{48}$, where $2.8 \leq i \leq 3.2$, $0.8 \leq j \leq 1.2$, i and j sum to about four, and k is about 12, for use with ultraviolet, visible, and infrared electromagnetic radiation. Merely by way of example, the compound is useful for electromagnetic radiation having wavelengths of 175-360 nm, but it would be recognized that the invention has a much broader range of applicability.

According to certain embodiments of the present invention, several kinds of borate crystals containing one or more kinds of Group 3, Group 13, and 4f metals and the like were prepared, and an occurrence experiment of an ultraviolet harmonic (wavelength: 266 nm) was carried out by irradiating with a green light laser (wavelength: 532 nm) onto these borate crystals. Thereby, the ability to experimentally make NLO materials was demonstrated that produce harmonic light below 360 nm. As a result, strong generation of second harmonic 266 nm from borate crystals was found that includes Y, La, and Al, and a novel NLO crystal in the form of yttrium lanthanum aluminum borate was achieved capable of transmitting and producing ultraviolet radiation below 360 nm.

Figure 5:
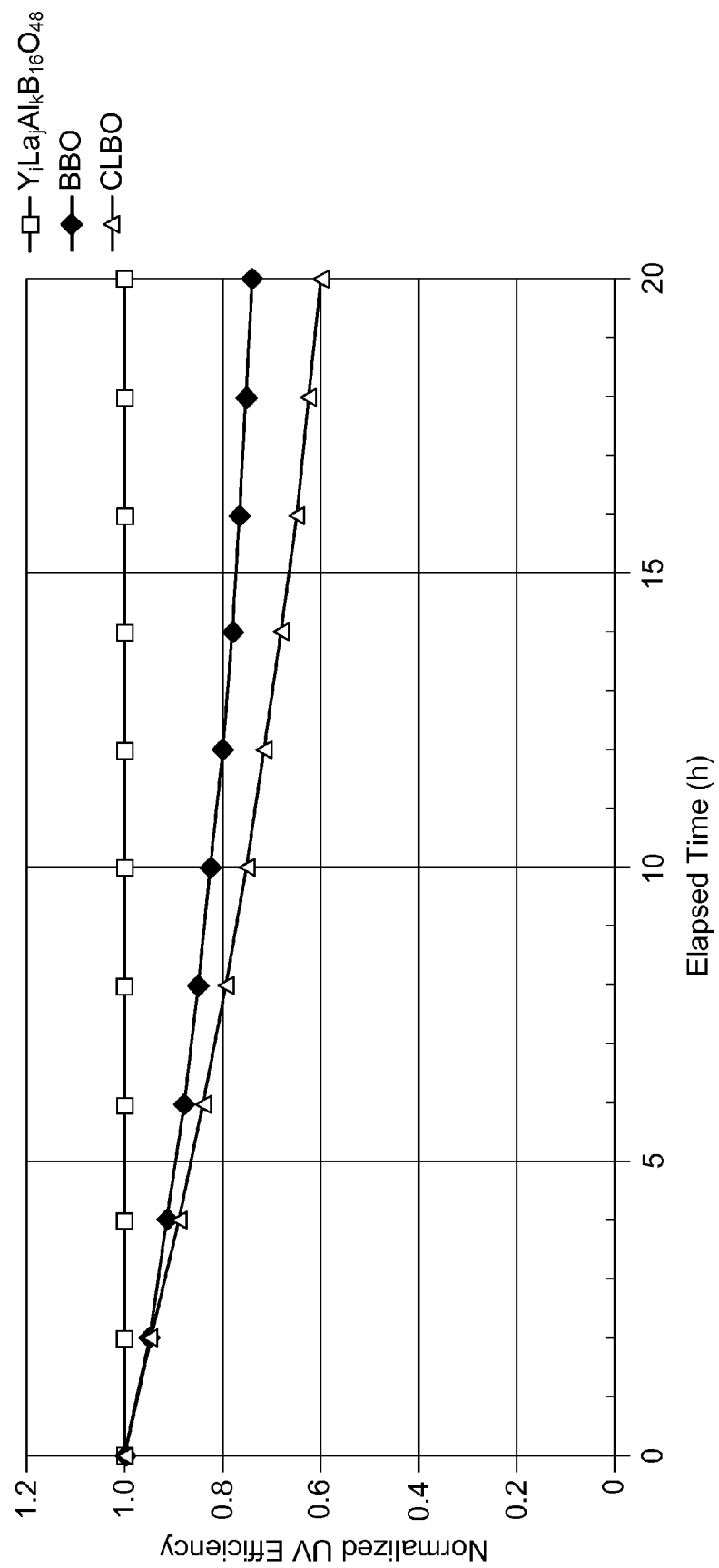
FIG. 5 shows typical long term behavior of 266 nm generated radiation from UV-grade huntite, BBO, and CLBO crystalline devices.

Because of its intrinsic non-hygroscopic nature, compounds described herein allow for relaxation of the need for crystal protection. In addition to supporting shorter-than-typical crystal lengths, the preferred materials provided by embodiments of the present invention allow a significant simplification in the mechanical design of the laser apparatus, namely the omission of an environmental isolation chamber surrounding the material or reductions in typical requirements. Purged or sealed environmental chambers are typically necessary in UV lasers that employ CLBO or BBO primarily due to their hygroscopicity. In contrast, the preferred materials (also referred to as the principal compound) remain insensitive to the presence of water, and therefore, water-based optical degradation has not been shown to be evident. As such, the non-hygroscopic nature of the principal compound directly imparts operational longevity as a constituent of a laser apparatus. The principal compounds provided by embodiments of the present invention demonstrate the lack of moisture uptake, and under ambient conditions, no long-term optical degradation is observed. By way of comparison, prior art materials BBO and CLBO are notorious for break down over time as a result of their reactivity with water vapor. FIG. 5 shows typical long term behavior of 266 nm generated radiation from UV-grade $Y_iLa_jAl_kB_{16}O_{48}$ in the mole fractions described herein, BBO, and CLBO crystalline devices. Mere ambient atmospheric moisture is sufficient to cause degradation of the commercial UV NLO materials in a matter of minutes of operation. This situation is of grave consequence for the use of BBO and CLBO frequency conversion devices in lasers, where the laser apparatus suffers diminished operational longevity and requires momentous design complexity/compromise to manage frequency converter crystal issues. The lack of the need for environmental isolation results in a very significant reduction in the complexity, cost, and required maintenance of the frequency converted laser apparatus and represents an overall improvement to the design and operation of the laser apparatus.

Embodiments of the present invention benefit from another feature of the NLO devices made from the principal compound, sans UV-inhibiting contaminants: the functional improvement of optical transmission in the UV. Contaminants that contribute to transmission loss cause localized heat generation and thermal de-phasing in the NLO device. While the primary effort by some embodiments of the invention is directed toward the reduction of spectrally-absorptive moieties (e.g. transition metal atoms) within NLO devices, de-phasing may be managed to some degree by thermally controlling the NLO device. Direct bonding of the NLO device to metal is an efficient means of regulating crystal temperature. The non-hygroscopic nature of the crystals included within the scope of the present invention permits the ability for it to be directly bonded to metal with solder and flux, thereby allowing the bonded crystal to be washed in aqueous-based or non-aqueous solvents.

It is an object of certain embodiments of the present invention to produce and utilize nonlinear optical materials that satisfy $R_iLa_jAl_kB_{16}O_{48}$, where $2.0 \leq i \leq 3.6$, $0.4 \leq j \leq 2.0$, i and j sum to about four, k is about 12, and R is selected from an elemental group consisting of Y and Lu, and manufactured by a method that eliminates or significantly reduces contaminants that prohibit device use in the UV spectrum. It is an object of other embodiments to provide an optical material or principal compound having the chemical formula $Y_iLa_jAl_kB_{16}O_{48}$, where $2.8 \leq i \leq 3.2$, $0.8 \leq j \leq 1.2$, i and j sum to about four, and k is about 12. In a particular embodiment, the optical material is characterized by an absence of reduction in the presence of contaminants that reduce the transmission of the optical material in the UV range (e.g., below 360 nm). More specifically, some embodiments of the present invention substantially exclude metals, such as those of d-block transition metals, and/or most 4f-block metals (e.g., lanthanides), from being present in the device so as to be useful in the UV below 360 nm.

It is an object of some embodiments of the present invention to provide methods for making nonlinear optical materials that satisfy the above composition without deleterious UV absorption. One embodiment comprises forming a mixture comprising from about 5 to about 20 wt % of a source of R, from about 20 to about 50 wt % of La, from about 7 to about 25 wt % of a source of Al, and from about 30 to about 50 wt % of boron oxide. If R is Y, then the source of R is generally yttrium oxide; if R is Lu, then the source of R is generally lutetium oxide. The source of La is generally lanthanum oxide, the source of Al is generally aluminum oxide, and the source of B is generally boron oxide or boric acid. The mixture is heated to a temperature and for a period of time sufficient to form the NLO material. For instance, the step of heating may comprise heating the mixture to a first temperature of at least 1000 K, and generally greater than about 1000 K. The mixture is then cooled. After cooling the mixture is comminuted (ground to a fine powder, such as by grinding with a mortar and pestle), and then heated to a second temperature of at least 1300 K, generally greater than about 1300 K.

Another method to form these crystalline materials may be but not limited to top-seeded solution growth as shown in FIG. 1. The method includes the following processes:
1. High purity oxide powders and chemicals are measured and mixed in appropriate proportions.
2. The mixture is loaded in a crucible and placed in a furnace.
3. The mixture is heated and caused to melt into a liquid.
4. After a time, melt temperature is brought near to its freezing point.
5. A cold finger material or a seed crystal is introduced to initiate crystallization.
6. Melt temperature and apparatus conditions are modified and monitored to encourage crystal growth.
7. When appropriate, the system is brought down to room temperature.
8. The crystal is removed from the system.

It should be appreciated that the specific steps illustrated above provide a particular method of synthesizing a nonlinear crystal according to an embodiment of the present invention. Other sequences of steps may also be performed according to alternative embodiments. For example, alternative embodiments of the present invention may perform the steps outlined above in a different order. Moreover, the individual steps illustrated above may include multiple sub-steps that may be performed in various sequences as appropriate to the individual step. Furthermore, additional steps may be added or removed depending on the particular applications. One of ordinary skill in the art would recognize many variations, modifications, and alternatives.

For example, the synthesis of $Y_3LaAl_{12}B_{16}O_{48}$ may be performed as follows. Yttrium oxide ($Y_2O_3$), having a purity of greater than 99.9%, lanthanum oxide ($La_2O_3$), having a purity of greater than 99.9%, aluminum oxide ($Al_2O_3$), having a purity greater than 99.9%, and boron oxide ($B_2O_3$), having a purity of greater than 99.9% were purchased from commercial vendors such as Aesar and Stanford Materials. A mixture was formed including about 13 wt % yttrium oxide, about 30 wt % lanthanum oxide, about 17 wt % aluminum oxide, and about 40 wt % boron oxide. This represents Step 1 of the above procedure. Steps 2-8 are conducted to form a crystal of the principal compound formulation with some remaining stoichiometric material residing in the crucible that serves as fluxing agents.

As discussed above, certain embodiments of the present invention are related to nonlinear optical (NLO) devices and electrooptic devices and the ability to employ such devices below 360 nm. Some embodiments of the present invention are related to nonlinear optical materials that satisfy the general formula $R_iLa_jAl_kB_{16}O_{48}$, where $2.0 \leq i \leq 3.6$, $0.4 \leq j \leq 2.0$, i and j sum to about four, k is about 12, and R is selected from an elemental group consisting of Y and Lu and are prepared without contaminants that prevent use in the ultraviolet (UV) section of the electromagnetic spectrum. Other embodiments are related to nonlinear optical materials that satisfy the general formula $Y_iLa_jAl_kB_{16}O_{48}$, where $2.8 \leq i \leq 3.2$, $0.8 \leq j \leq 1.2$, i and j sum to about four, and k is about 12. These materials may be prepared so that the presence of contaminants that prevent use in the ultraviolet (UV) section of the electromagnetic spectrum are limited to predetermined levels.

UV-inhibiting contaminants can be introduced by several sources throughout the process of making crystals. The most significant source of contaminants is the starting materials. By utilizing very high purity chemical ingredients, embodiments reduce UV absorbing 3d-5d transition metals (e.g., elements 22-32, 40-52, and 72-84) and most lanthanides (e.g., elements 58-70) to concentration levels typically less than 10 ppm. In some embodiments, the concentrations of these elements is at levels less than 1000 ppm. Other concentrations are described throughout the present specification.

The other major contamination component is the charge crucible. Preferably, the charge crucible is inert with respect to the nutrient, tolerant of the top furnace temperature, and mechanically strong over the process temperature range. The charge crucible is typically made using platinum group metals, with Pt surfaces being the most preferred because of their inert nature with respect to oxides and oxygen. Other considerations in reducing the presence of UV absorbing contaminants include the use of high purity furnace ceramics of sufficient thermal integrity, controlled atmospheric gas purity, and inert means of securing the crystallization seed. With control of contaminants in the starting materials and the furnace, UV-blocking contaminants are held to a level that does not compromise the primary material's intrinsic UV transmission properties.

According to some embodiments of the present invention, the nonlinear optical material is used as an NLO device for operation below 360 nm. In another example, the nonlinear optical material is used with a laser source for a device that generates optical radiation below 360 nm. In yet another example, the nonlinear optical material is used with a light source for a device that generates optical radiation below 360 nm. In yet another example, the nonlinear optical material is formed in the trigonal crystal class for use below 360 nm. In yet another example, the nonlinear optical material is formed in the space group R32 for use below 360 nm.

It is an object of certain embodiments of the present invention to produce and utilize nonlinear optical materials that satisfy $Y_iLa_jAl_kB_{16}O_{48}$, where $2.8 \leq i \leq 3.2$, $0.8 \leq j \leq 1.2$, i and j sum to about four, and k is about 12 and manufactured by a method that eliminates or significantly reduces contaminants that prohibit device use in the UV spectrum. More specifically, some embodiments of the present invention substantially exclude transition metals from being present in the device so as to be useful in the UV below 360 nm. In a specific embodiment, the UV transmission of select borate huntites is extended by avoiding the inclusion of 3d-5d transition metals (e.g., elements 22-30, 40-48, and 72-80)and non-stoichiometric lanthanide impurities (e.g., elements 58-70). For example, the inclusion of such elements may be at a level of less than 10,000, 5,000, 2,000, 1,000, 500, 250, 100, 50, or 10 parts per million. In addition, the absence of superfluous metals in the primary crystal composition reduces the overall bulk spectral absorption over its entire transparency range, such as from 175 to 2500 nm. With the embodiments described herein, the intrinsic transparency may be realized. Thus, in some embodiments, the optical transmittance of the composition of matter is greater than 0.9 at 250 nm. This particular value and wavelength is not intended to limit embodiments of the present invention, but to serve as an example of the optical properties of the crystals described herein. In other embodiments, the optical transmittance is greater than 0.7, greater than 0.75, greater than 0.8, greater than 0.85, or greater than 0.9 at 200 nm. In yet other embodiments, the optical transmittance is greater than 0.8, greater than 0.85, greater than 0.9, or greater than 0.95 at 250 nm, or the like. One of ordinary skill in the art would recognize many variations, modifications, and alternatives.

As discussed above, it is an object of some embodiments of the present invention to provide methods for making nonlinear optical materials that satisfy $R_iLa_jAl_kB_4O_{12}$, where $0.5 \leq i \leq 0.9$, $0.1 \leq j \leq 0.5$, i and j sum to about one, k is about three, and R is selected from an elemental group consisting of Y and Lu, without the deleterious UV absorption. In some embodiments, the NLO materials satisfy $Y_iLa_jAl_kB_{16}O_{48}$, where $2.8 \leq i \leq 3.2$, $0.8 \leq j \leq 1.2$, i and j sum to about four, and k is about 12. One embodiment comprises forming a mixture comprising from about 10 to about 30 mol % of a source of R (e.g., Y), from about 10 to about 40 mol % of La (e.g., lanthanum oxide), from about 10 to about 25 mol % of a source of Al (e.g., aluminum oxide), and from about 25 to about 50 mol % of boron oxide. If R is Y, then the source of Y generally is yttrium oxide; if R is Lu, then the source of Lu is generally is lutetium oxide. The mixture is heated to a temperature and for a period of time sufficient to form the NLO material. For instance, the step of heating may comprise heating the mixture to a first temperature of at least 1000 K, and generally greater than about 1000 K. The mixture is then cooled. After cooling the mixture is comminuted (ground to a fine powder, such as by grinding with a mortar and pestle), and then heated to a second temperature of at least 1300 K, generally greater than about 1300 K.

As discussed above, FIG. 1 is a simplified method for making optical compound according to an embodiment of the present invention. This diagram is merely an example, which should not unduly limit the scope of the claims. One of ordinary skill in the art would recognize many variations, alternatives, and modifications. The method 100 includes a process 110 for measuring and mixing chemicals (e.g., a set of constituent components), a process 120 for transferring mixture to crucible and furnace, a process 130 for melting mixture, a process 140 optimizing furnace conditions for crystallization, a process 150 for introducing seed and starting crystallization, and a process 160 for cooling system and extracting crystal. Although the above has been shown using a selected sequence of processes, there can be many alternatives, modifications, and variations. For example, some of the processes may be expanded and/or combined. Other processes may be inserted to those noted above. Depending upon the embodiment, the specific sequence of processes may be interchanged with others replaced. For example, the process 150 is modified to use spontaneous nucleation, or use conventional optical crystal growth procedures to introduce a cold finger to the melt surface. Further details of these processes are found throughout the present specification and more particularly below.

At the process 110, certain chemicals (i.e., a set of constituent components) are measured and mixed. For example, high purity oxide powders and chemicals are measured and mixed in appropriate proportions. At the process 120, the mixture is transferred to crucible and furnace. For example, the mixture is loaded in a crucible and placed in a furnace. At the process 130, the mixture is melted. For example, the mixture is heated and caused to melt into a liquid.

At the process 140, furnace conditions are optimized for crystallization. For example, after a time, the melt temperature is brought near to its freezing point. At the process 150, a seed is introduced and the crystallization is started. For example, a seed crystal is introduced to initiate crystallization. In another example, the process 150 is modified to use a cold finger material to initiate crystallization. In yet another example, the process 150 is modified to use spontaneous nucleation to initiate crystallization. Additionally, the melt temperature and apparatus conditions are modified and monitored to encourage crystal growth. At the process 160, the system is cooled and the crystal is extracted. For example, when appropriate, the system is brought down to room temperature. The crystal is removed from the system and ready for tests or further processing.

As an example for the method 100, the synthesis of $R_3LaAl_{12}B_{16}O_{48}$, where R=Y is performed as follows:

At the process 110, yttrium oxide ($Y_2O_3$), having a purity of greater than 99.9%, lanthanum oxide ($La_2O_3$), having a purity of greater than 99.9%, aluminum oxide ($Al_2O_3$), having a purity greater than 99.9%, and boron oxide ($B_2O_3$), having a purity of greater than 99.9% are obtained. For example, these chemicals are acquired from commercial vendors such as Aesar and Stanford Materials. A mixture is formed including about 12 wt % $Y_2O_3$, about 33 wt % $La_2O_3$, about 16 wt % $Al_2O_3$, and about 39 wt % $B_2O_3$ as the set of constituent components. In a particular embodiment, the yttrium source and the aluminum source are provided and then are mixed with a lanthanum source and a boron source. The set of constituent components may be characterized by a predetermined amount of nutrients and a predetermined amount of solvents. In an embodiment, the mole ratio of lanthanum to yttrium is in a range of more than 1.5:1 and a mole ratio of the predetermined amount of nutrients to the predetermined amount of solvents is in a range of 1:1 to 1:5. Other ranges suitable for forming compositions of matter in accordance with embodiments of the present invention are also included within the scope of the present invention.

At the process 120, the mixture is loaded into a crucible and placed in a high-temperature furnace with atmospheric environment control. For example, either ambient or an inert atmosphere is satisfactory. At the process 130, the mixture is heated in 12 hours from room temperature to a predetermined temperature ranging from 1450 to 1575 to thereby form a resultant melt. In a preferred embodiment, the predetermined temperature is approximately 1500 K, for example, between 1450 and 1575 K, between 1475 and 1550 K, or between 1475 and 1525 K. The resulting melt is allowed to soak at the predetermined or another temperature for a predetermined period of time (e.g., about 1 to 3 days).

At the process 140, the liquid mixture (i.e., the resultant melt) is cooled at a rate of less than or equal to 20 K/hour to a temperature near its freezing point. For example, the temperature ranges from about 1500 to 1400 K. At the temperature, the mixture is held for about 8 hours. In other embodiments, the mixture is held at the temperature for other times, for example, a time ranging from about 8 hours to about 72 hours. In a particular embodiment, the time is 48 hours. At the process 150, by spontaneous nucleation, or by using conventional optical crystal growth procedures to introduce a crystalline seed or cold finger to the melt surface, the product begins to form while cooling to a final temperature of 1300 K at a rate of about 1-5 K/day. Thus, in embodiments of the present invention, one or more nonlinear crystals are formed as a precipitate from the resultant melt. Additionally, during the course of the growth, the melt temperature and apparatus conditions are monitored and optionally modified to encourage crystal growth, either by an operator and/or by the automated control system on the furnace.

At the process 160, the system is then cooled to room temperature at a cooling rate of about 50 K/hour. One or more colorless, transparent crystals of $Y_3LaAl_{12}B_{16}O_{48}$ are obtained and removed from the furnace. Although in the embodiment described above, the crystal formula is $Y_3LaAl_{12}B_{16}O_{48}$, other chemical formulas are included within the scope of the present invention, including yttrium mole fractions ranging from about 2.96 to about 3.08 and lanthanum mole fractions ranging from about 0.92 to about 1.04. Thus, the exemplary embodiment in which the yttrium mole fraction is three and the lanthanum mole fraction is one is provided for purposes of illustration and not intended to limit embodiments of the present invention.

Another object of some embodiments of the present invention is related to the formation of a particular phase that is stabilized within the compositional range of compounds described herein. The general stoichiometry of $Y_3LaAl_{12}B_{16}O_{48}$ consistently forms under a limited range of starting compositions. Three of the four starting materials (i.e., yttrium, lanthanum, and boron oxides) are used in stoichiometric excess to act as a solvent in addition to being nutrients for crystal formation of the principal compound. Table 2 lists several starting material compositions that yield the new crystalline phase. The values for the starting materials listed in Table 2 are not intended to be exhaustive, but to illustrate starting compositions that may be used to form crystals having the desired chemical composition. Other starting material compositions are therefore included within the scope of embodiments of the present invention.

TABLE 2

Yttrium:lanthanum:aluminum:borate molar composition and crystal ratios and resulting crystal formulae

| Starting Metal Oxide Composition Y:La:Al:B | Crystalline Composition Y:La:Al:B | Measured Data Crystal Formula |
|---|---|---|
| 4:8:12:44 | 3:1:12:16 | $Y_{3.00}La_{1.00}Al_{12.00}B_{16}O_{48}$ |
| 4:9:12:48 | 3:1:12:16 | $Y_{3.04}La_{0.96}Al_{12.00}B_{16}O_{48}$ |
| 4:6:12:40 | 3:1:12:16 | $Y_{3.08}La_{0.96}Al_{11.96}B_{16}O_{48}$ |

In addition to the starting metal oxide compositions listed in Table 2, other starting compositions are included within the scope of embodiments of the present invention. For example, the ratios 3:8:12:44, 4:6:12:38, 4:7:12:41, 4:12:12:56, 4:10:12:50, are proportions suitable to produce crystals that satisfy the compositional invention. Due to the range of excess starting concentrations of boron and lanthanum to act as a mixture's solvent, the molar ratio of boron to lanthanum can range from 4:1 to 10:1. In some embodiments, the constituent components are characterized by a predetermined amount of nutrients, i.e., the starting material sources of elements that contribute to the stoichiometric crystalline end product, and a predetermined amount of solvents, i.e., other starting materials that do not contribute to the stoichiometric crystalline end product but may constitute excess amounts of the very same nutrient starting materials. The mole ratio of the predetermined amount of solvents to the predetermined amount of nutrients ranges from about 1:1 to about 1:5. In a particular embodiment, the ratio of lanthanum to yttrium is more than 1.5:1, for example, 2:1 or 3:1.

The crystal structures provided by embodiments of the present invention are derived from a non-congruent melt of nutrient oxides, so solvent(s) are needed to reduce the melt temperature below the peritectic decomposition temperature of about 1575 K. In this method, the stoichiometric excess of yttrium, lanthanum, and boron oxides in the starting materials composition serve as a solvent for the principal compound formed during single crystal growth. As shown in Table 2, the extracted crystal composition nominally remains the same as determined by elemental analyses, regardless of the illustrated variations in the starting material proportions. Thus, the crystallized material represents a thermodynamically-stabilized new phase, rather than merely being a composition along a solid-solution continuum. As such, variations in the starting materials (e.g., starting Y:La:Al:B compositions of either 4:8:12:44 or 4:9:12:48) will result in a crystallized material having the crystalline composition of 3:1:12:16. The remaining materials left behind in the crucible after the single crystal growth process represent a mixture of excess solvating yttrium, lanthanum, and boron oxides along with uncrystallized principal material. The inventor has appreciated that although a range of mole fractions for the elements of the composition are theoretically possible, the actual ranges that result in thermodynamically-stabilized phases are limited. Additionally, in order to provide a NLO material that is suitable for optical applications (for example, at UV wavelengths less than 360 nm), the crystallographic structure of the stable phase is only one of the material properties of interest. Other material properties including resultant refractive indices for favorable phase matching at operating wavelengths, transmittance at operating wavelengths, the nonlinear drive derived from the structural non-centrosymmetric arrangement, and the like are provided concurrently with the stability of the phase in NLO crystals provided by embodiments of the present invention. Thus, large theoretical ranges are merely that, theoretical ranges that infrequently provide actual crystals useful for nonlinear optics applications.

Embodiments of the present invention provide a predetermined amount of lanthanum in order to provide a solvent for the crystal melt, however other solvent modifiers may be utilized. Thus, some of the methods and processes described herein utilize an excess of lanthanum and/or boron materials to provide solvent functionality typically provided by $K_2MoO_4$ and $K_2Mo_3O_{10}$ or other solvents. By using materials present in the final crystalline composition as a solvent, the incorporation of UV absorbing elements are reduced or eliminated, providing for high transmission properties in the UV range of the spectrum. In addition, common solvents that are not known to impede UV transmittance may be used for high temperature crystal growth of the principal compound. For example, lithium borates may be utilized as secondary solvent modifiers to affect melt acidity and thereby modify the mixture's solvation of nutrient constituents, e.g. lithium tetraborate acts as an acidic solvent flux, and lithium metaborate is an accustomed basic solvent flux. The viscosity of the charge mixture can also be modified by the addition of common alkali metal halides, e.g. lithium, sodium, or potassium fluorides. Again, fluxing agents are selected so as to avoid moieties that impede UV transmittance and to preclude general incorporation into the crystal structure.

The resulting principal compound was determined to be isostructural to the mineral $CaMg_3C_4O_{12}$, huntite. Added to the family of huntite borate analogs, yttrium lanthanum aluminum borate forms in the trigonal system, rhombohedral class in the space group R32. Table 3 lists representative crystallographic data and other physical properties for $Y_3LaAl_{12}B_{16}O_{48}$.

TABLE 3

Physical properties of $Y_3LaAl_{12}B_{16}O_{48}$ crystal
$Y_3LaAl_{12}B_{16}O_{48}$

| | |
|---|---|
| Class | Rhombohedral |
| Space Group | R32 |
| a | 588.5 pm |
| α | 104.3° |
| Crystal density | 3.76 g/cm$^3$ |
| Color | colorless |
| Optical axes | uniaxial |
| Hardness | 7 Mohs |
| Morphology | Trapezohedral |
| Cleavage | (100) |
| Hygroscopicity | none |

According to an embodiment of the present invention, the NLO materials described herein are manufactured by a method that eliminates or significantly reduces contaminants that prohibit device use in the UV spectrum. More specifically, some embodiments of the present invention substantially exclude elements, such as 3d-5d transition metals and 4f lanthanides other than Y, La, and Lu, from being present in the optical device. The absence of these elements enables device operation for applications such as lasers, frequency converters and other optical devices at wavelengths in the UV below 360 nm.

Figure 2:
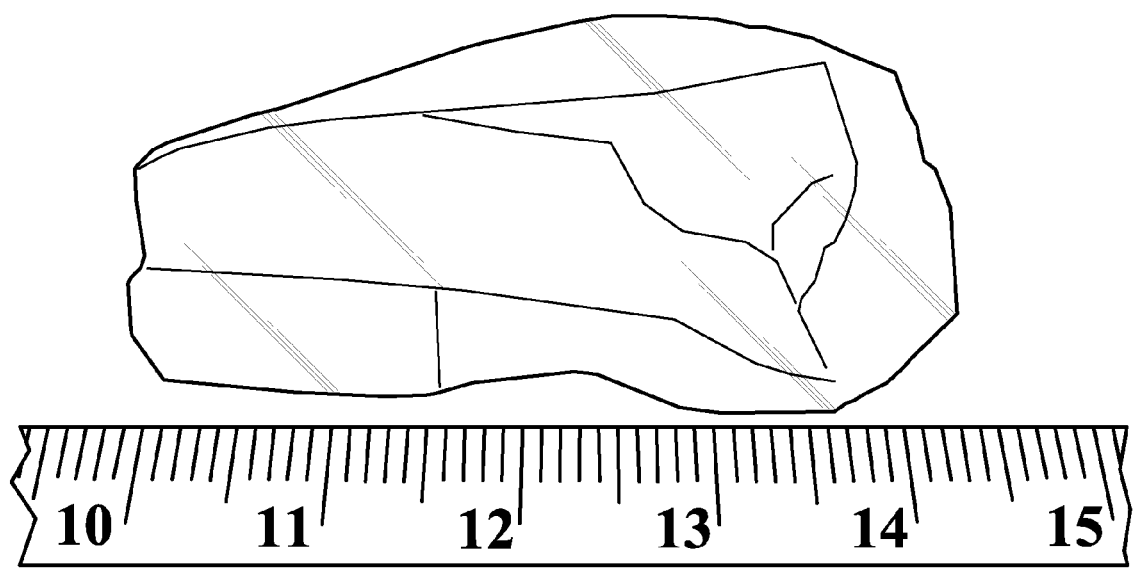
FIG. 2 is a simplified image of an optical compound according to an embodiment of the present invention.

FIG. 2 is a simplified image of an optical compound according to an embodiment of the present invention. This diagram is merely an example, which should not unduly limit the scope of the claims. One of ordinary skill in the art would recognize many variations, alternatives, and modifications. The optical compound includes $Y_iLa_jAl_kB_{16}O_{48}$, where $2.8 \leq i \leq 3.2$, $0.8 \leq j \leq 1.2$, i and j sum to about four, and k is about 12, made by the method 100 as discussed above. The synthesis starts with yttrium oxide ($Y_2O_3$), lanthanum oxide ($La_2O_3$), aluminum oxide ($Al_2O_3$), and boron oxide ($B_2O_3$), all reagents having purities greater than 99.9%. As shown in FIG. 2, the 20×15×10 mm crystal is sufficiently large and possesses optical transparency that enables it to function as a laser light modification device.

Figure 3:
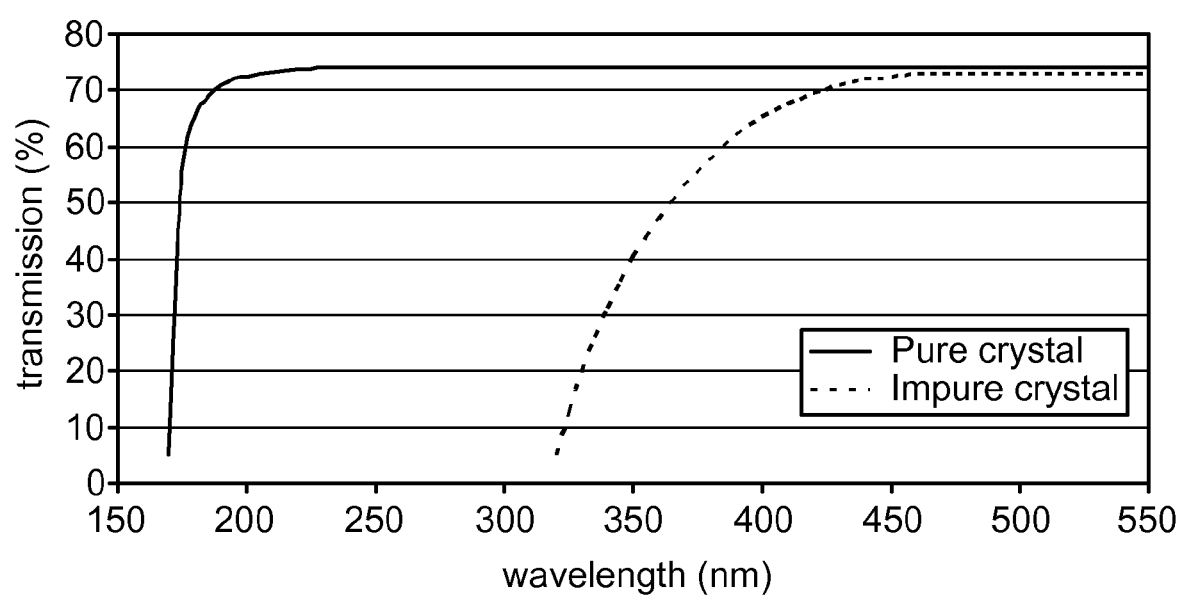
FIG. 3 is a simplified diagram showing transmission characteristics for an optical compound according to an embodiment of the present invention.

FIG. 3 is a simplified diagram showing transmission characteristics for an optical compound according to an embodiment of the present invention. This diagram is merely an example, which should not unduly limit the scope of the claims. One of ordinary skill in the art would recognize many variations, alternatives, and modifications. The optical compound includes $Y_iLa_jAl_kB_{16}O_{48}$, where $2.8 \leq i \leq 3.2$, $0.8 \leq j \leq 1.2$, i and j sum to about four, and k is about 12, made by the method 100 as discussed above. The synthesis starts with yttrium oxide ($Y_2O_3$), lanthanum oxide ($La_2O_3$), aluminum oxide ($Al_2O_3$), and boron oxide ($B_2O_3$). As shown in FIG. 3, a curve 300 shows the transmission percentage as a function of wavelength. The transmission percentage does not vary due to absorption features from 360 nm to about 175 nm. It should be noted that the transmission characteristics illustrated in FIG. 3 do not account for Fresnel losses at interfaces. Thus, the actual percent of power transmitted through the optical compound is actually higher than illustrated by the data shown in FIG. 3. The inventors believe that the transmission percentage can be over 75%, over 80%, over 85%, over 90% or over 95% at given wavelengths.

Figure 4A:
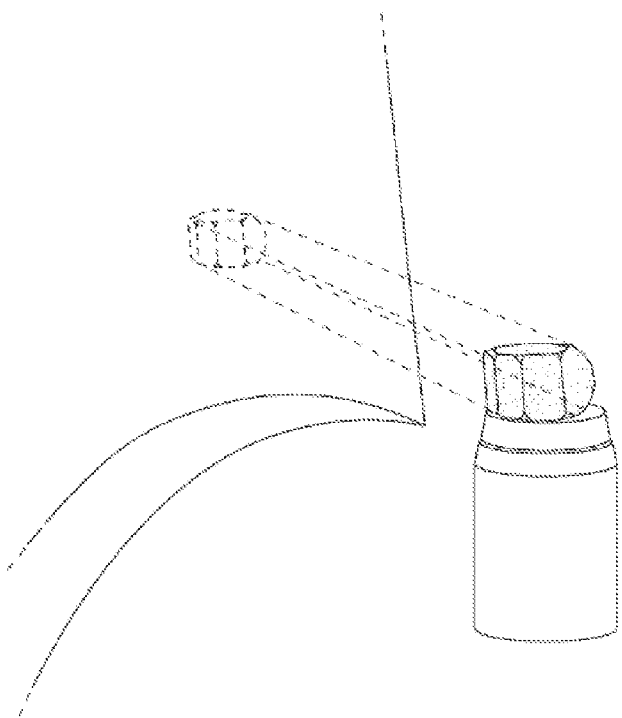
FIG. 4A is a simplified diagram showing frequency conversion by an optical compound according to an embodiment of the present invention.

FIG. 4A is a simplified diagram showing frequency conversion by an optical compound according to an embodiment of the present invention. This diagram is merely an example, which should not unduly limit the scope of the claims. One of ordinary skill in the art would recognize many variations, alternatives, and modifications. The optical compound includes $Y_iLa_jAl_kB_{16}O_{48}$, where $2.8 \leq i \leq 3.2$, $0.8 \leq j \leq 1.2$, i and j sum to about four, and k is about 12, made by the method 100 as discussed above. The synthesis starts with yttrium oxide ($Y_2O_3$), lanthanum oxide ($La_2O_3$), aluminum oxide ($Al_2O_3$), and boron oxide ($B_2O_3$). For example, the optical compound is the crystal as shown in FIG. 2. During the experiment and by way of example, laser light with a wavelength of about 532 nm was delivered to a $Y_3LaAl_{12}B_{16}O_{48}$ crystal greater than 1 mm$^3$ in size. In response, the crystal output a light beam received by an imaging scintillator card, which was sensitive to ultraviolet radiation. As shown in FIG. 4A, an image was taken using a camera that was made blind to 532 nm with a filter for the photograph.

Figure 4B:
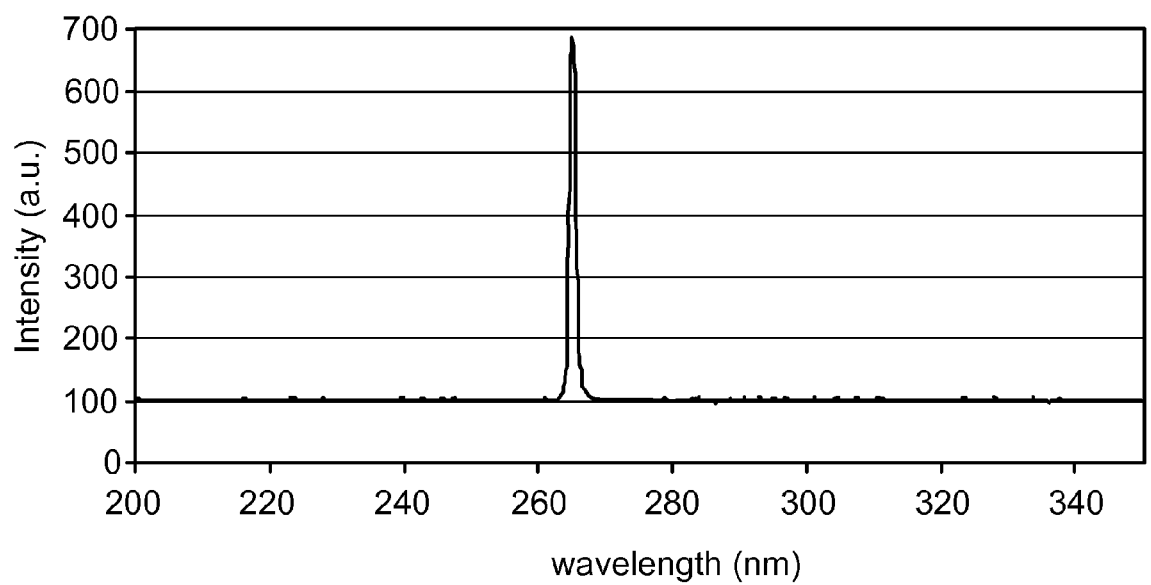
FIG. 4B is a spectral profile for the converted 266 nm light.

For the benefit of a photographed image, a scintillator card is used to visibly detect the presence of the 266 nm radiation and a blue fluorescence spot image was observed. Hence ultraviolet light was generated by the $Y_3LaAl_{12}B_{16}O_{48}$ crystal through a SHG process and was detected by the imaging scintillator card. In another demonstration, a bandpass mirror specific for 266 nm light transmission was placed between the $Y_3LaAl_{12}B_{16}O_{48}$ crystal and the imaging scintillator card. Blue fluorescence, which is caused by UV radiation similar to that in FIG. 4A, was also observed, and FIG. 4B is the output spectral profile of the converted 266 nm light. Hence, deep ultraviolet light at 266 nm was generated by the $Y_3LaAl_{12}B_{16}O_{48}$ crystal.

As discussed above, and further emphasized here, the method can be used to make various types of optical compounds. According to one embodiment of the present invention, a compound for nonlinear optics for use at wavelengths of 175-360 nm is made by the method 100. The compound includes a material for nonlinear optics comprising $Y_3LaAl_{12}B_{16}O_{48}$. The compound is free from bearing UV-blocking impurities of at least 1000 parts per million. According to yet another embodiment of the present invention, a compound for nonlinear optics for use at wavelengths of 175-360 nm is made by the method 100. The compound may comprise a material for nonlinear optics includes $R_iLa_jAl_kB_{16}O_{48}$, where $2.0 \leq i \leq 3.6$, $0.4 \leq j \leq 2.0$, i and j sum to about four, k is about 12, and R is selected from an elemental group consisting of Y and Lu. The compound may also comprise a material for nonlinear optics includes $Y_iLa_jAl_kB_{16}O_{48}$, where $2.8 \leq i \leq 3.2$, $0.8 \leq j \leq 1.2$, i and j sum to about four, and k is about 12. The compound is free from bearing UV-blocking impurities of at least 1000 parts per million.

As discussed above, according to certain embodiments, each of various types of optical compounds made by the method 100 is free from bearing UV-blocking impurities of at least 1000 parts per million. For example, the compound is free from bearing UV-blocking impurities of at least 500 parts per million. In another example, the compound is free from bearing UV-blocking impurities of at least 100 parts per million. In yet another example, the compound is free from bearing UV-blocking impurities of at least 10 parts per million. In yet another example, the compound is free from bearing UV-blocking impurities of at least 1 part per million. In yet another example, the compound is substantially free from bearing UV-blocking impurities. According to some embodiments of the present invention, each of various types of optical compounds made by the method 100 each is free from any impurity of at least 1000 parts per million that can prevent the compound from being used for nonlinear optics at 360 nm and below. For example, the compound is free from any such impurity of at least 500 parts per million. In another example, the compound is free from any such impurity of at least 100 parts per million. In yet another example, the compound is free from any such impurity of at least 10 parts per million. In yet another example, the compound is free from any such impurity of at least 1 part per million. In yet another example, the compound is substantially free from any such impurity.

As discussed above, according to certain embodiments, each of various types of optical compounds made by the method 100 has a volume greater than about 0.01 mm$^3$. In another embodiment, the volume of the NLO materials may be greater than about 0.1 mm$^3$ It will be appreciated that depending on the application, the crystal volume may be limited in size as appropriate to the particular application, for example a volume of less than about 1,000 cm$^3$. For example, the compound has a volume greater than about 0.1 mm$^3$ or about 1 mm$^3$. In another example, the compound has a volume greater than about 10 mm$^3$.

According to some embodiments, various types of optical compounds made by the method 100 can be used for nonlinear optics at 360 nm and below. For example, the use is associated with a wavelength ranging from about 360 nm to 175 nm. In yet another example, the use is associated with a device that generates optical radiation below 360 nm. In yet another example, the device comprises an NLO system, the compound associated with a laser system, and/or the compound associated with a light source.

According to certain embodiments, the method 100 can be used to make a compound for nonlinear optics for use at 360 nm and below. For example, the compound is associated with the trigonal crystal class and may be used for applications below 360 nm. In another example, the compound is associated with space group R32 and may be used for applications below 360 nm.

According to yet another embodiment of the present invention, a method for making a compound for nonlinear optics for use at wavelengths of 175-360 nm includes providing a plurality of materials. The plurality of materials includes a lanthanum bearing compound, and the lanthanum bearing compound is capable of being decomposed into at least lanthanum oxide upon heating. Additionally, the method includes mixing the plurality of materials to form a mixture based on at least information associated with a predetermined proportion, starting a crystallization process in the mixture to form a crystal, and removing the crystal from the mixture, the crystal including lanthanum. For example, the plurality of materials comprises lanthanum oxide. In another example, the plurality of material further comprises boron oxide. In yet another example, the method further includes placing the mixture into a furnace. In yet another example, the method further includes heating the mixture to a first predetermined temperature, and cooling the mixture to a second predetermined temperature. In yet another example, the starting a crystallization process comprises inserting a crystalline seed to a melt surface. In yet another example, the crystal includes $Y_iLa_jAl_kB_{16}O_{48}$, where $2.8 \leq i \leq 3.2$, $0.8 \leq j \leq 1.2$, i and j sum to about four, and k is about 12. In yet another example, the method is implemented according to the method 100.

According to yet another embodiment of the present invention, a method for making a compound for nonlinear optics for use at wavelengths of 175-360 nm includes providing a plurality of materials. The plurality of materials includes an yttrium bearing compound, and the yttrium bearing compound is capable of being decomposed into at least yttrium oxide upon heating. Additionally, the method includes mixing the plurality of materials to form a mixture based on at least information associated with a predetermined proportion, starting a crystallization process in the mixture to form a crystal, and removing the crystal from the mixture, the crystal including yttrium. For example, the plurality of materials includes yttrium oxide. In another example, the plurality of material further includes boron oxide. In yet another example, the method further includes placing the mixture into a furnace. In yet another example, the method further includes heating the mixture to a first predetermined temperature, and cooling the mixture to a second predetermined temperature. In yet another example, the starting a crystallization process comprises inserting a crystalline seed to a melt surface. In yet another example, the crystal includes $Y_iLa_jAl_kB_{16}O_{48}$, where $2.8 \leq i \leq 3.2$, $0.8 \leq j \leq 1.2$, i and j sum to about four, and k is about 12. In yet another example, the method is implemented according to the method 100.

It is understood the examples and embodiments described herein are for illustrative purposes only and that various modifications or changes in light thereof will be suggested to persons skilled in the art and are to be included within the spirit and purview of this application and scope of the appended claims.

What is claimed is:

1. An optical system comprising:
   a laser system operable to provide an output at a first wavelength propagating along an optical path; and
   a frequency conversion stage disposed along the optical path and operable to convert the first wavelength to a second wavelength, wherein the frequency conversion stage includes a nonlinear optical element having a chemical formula of $Y_iLa_jAl_kB_{16}O_{48}$, where $2.0 \leq i \leq 3.6$, $0.4 \leq j \leq 2.0$, i and j sum to about four, and k is about 12 and having an optical transmittance greater than 0.7 at 250 nm.

2. The optical system of claim 1 wherein the first wavelength is about 532 nm, and the second wavelength is about 266 nm.

3. The optical system of claim 2 wherein the frequency conversion stage is further operable to convert the first wavelength and a third wavelength to a fourth wavelength, wherein the third wavelength is about 1064 nm and the fourth wavelength is about 355 nm.

4. The optical system of claim 1 wherein $2.8 \leq i \leq 3.2$, $0.8 \leq j \leq 1.2$.

5. The optical system of claim 1 wherein the nonlinear optical element comprises a nonlinear optical crystal associated with the trigonal crystal class of space group R32.

6. The optical system of claim 5 wherein a concentration of molybdenum in the nonlinear optical crystal is less than 1,000 parts per million.

7. The optical system of claim 1 wherein the nonlinear optical element includes one or more surfaces exposed to ambient humidity.

8. The optical system of claim 1 wherein a nonlinear optical element is characterized by an optical transmittance of greater than 0.7 at 200 nm.

9. The optical system of claim 1 wherein the nonlinear optical element is characterized by a size between about 1 mm$^3$ and 1,000 mm$^3$.

10. The optical system of claim 9 wherein the nonlinear optical element is characterized by a size between about 10 mm$^3$ and 200 mm$^3$.

* * * * *